(12) United States Patent
Oda et al.

(10) Patent No.: US 11,115,024 B2
(45) Date of Patent: Sep. 7, 2021

(54) INTEGRATED CIRCUIT, TEST METHOD FOR TESTING INTEGRATED CIRCUIT, AND ELECTRONIC DEVICE

(71) Applicant: KABUSHIKI KAISHA TOSHIBA, Minato-ku (JP)

(72) Inventors: Masato Oda, Yokohama (JP); Shinichi Yasuda, Setagaya (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 28 days.

(21) Appl. No.: 16/816,528

(22) Filed: Mar. 12, 2020

(65) Prior Publication Data
US 2021/0083672 A1 Mar. 18, 2021

(30) Foreign Application Priority Data

Sep. 12, 2019 (JP) .............................. JP2019-166469

(51) Int. Cl.
*H03K 19/17728* (2020.01)
*H03K 19/1776* (2020.01)
*H03K 17/80* (2006.01)
*H03K 19/173* (2006.01)
*G01R 31/317* (2006.01)
(Continued)

(52) U.S. Cl.
CPC . *H03K 19/17728* (2013.01); *G01R 31/31707* (2013.01); *G01R 31/31713* (2013.01); *G11C 17/16* (2013.01); *G11C 17/18* (2013.01); *H03K 17/80* (2013.01); *H03K 19/1735* (2013.01);
(Continued)

(58) Field of Classification Search
CPC ......... H03K 19/17728; H03K 19/1776; H03K 17/80; H03K 19/1735; H03K 19/1737; H03K 17/693; G01R 31/31713; G01R 31/31707; G11C 17/18; G11C 17/16; G11C 11/1675; G11C 11/1655; G11C 11/1657; G11C 13/0069; G11C 13/0026;
(Continued)

(56) References Cited

U.S. PATENT DOCUMENTS 5,424,655 A * 6/1995 Chua ...................... G11C 17/18
326/40
5,528,600 A * 6/1996 El Ayat .......... G01R 31/318516
324/750.3
(Continued)

*Primary Examiner* — Don P Le
(74) *Attorney, Agent, or Firm* — Oblon, McClelland, Maier & Neustadt, L.L.P.

(57) ABSTRACT

An integrated circuit of an embodiment includes: a logic circuit; and a switch circuit, the logic circuit including: a first memory; a look-up table circuit having a first output terminal; a first selection circuit having a first input terminal connecting to the first output terminal, a second input terminal receiving scan input data, and a second output terminal, the first selection circuit selecting one of the first and second input terminals and connect the selected one to the second output terminal; a flip-flop having a third input terminal connected to the second and third output terminals; and a second selection circuit having a fourth and fifth input terminals connected to the third output terminal and the first output terminal respectively, and a fourth output terminal, the second selection circuit selecting one of the fourth and fifth input terminals and connect the selected one to the fourth output terminal.

14 Claims, 12 Drawing Sheets

(51) Int. Cl.
*G11C 17/18* (2006.01)
*G11C 17/16* (2006.01)

(52) U.S. Cl.
CPC ..... *H03K 19/1737* (2013.01); *H03K 19/1776* (2013.01)

(58) Field of Classification Search
CPC ............ G11C 13/0028; G11C 2213/77; G11C 29/04; G11C 7/1006
USPC ..................................................... 326/38–41
See application file for complete search history.

(56) References Cited

U.S. PATENT DOCUMENTS

| | | | | |
|---|---|---|---|---|
| 5,617,021 | A * | 4/1997 | Goetting | G01R 31/318519 324/538 |
| 6,081,129 | A | 6/2000 | Apland et al. | |
| 6,470,485 | B1 * | 10/2002 | Cote | G01R 31/318519 324/613 |
| 6,968,487 | B1 * | 11/2005 | Bryant | G06F 30/394 714/726 |
| 7,437,635 | B1 * | 10/2008 | Dang | G01R 31/318544 326/38 |
| 9,948,305 | B2 | 4/2018 | Oda et al. | |
| 2013/0024737 | A1 * | 1/2013 | Marinissen | G01R 31/318513 714/727 |
| 2013/0293263 | A1 * | 11/2013 | Kurokawa | H03K 19/094 326/41 |
| 2014/0351556 | A1 * | 11/2014 | Fawaz | G06F 30/34 712/15 |
| 2017/0350939 | A1 * | 12/2017 | Goel | G01R 31/318538 |
| 2017/0373692 | A1 * | 12/2017 | Devlin | G01R 31/318541 |

\* cited by examiner

INTEGRATED CIRCUIT, TEST METHOD FOR TESTING INTEGRATED CIRCUIT, AND ELECTRONIC DEVICE

CROSS REFERENCE TO RELATED APPLICATIONS

This application is based upon and claims the benefit of priority from the prior Japanese Patent Application No. 2019-166469, filed on Sep. 12, 2019, the entire contents of which are incorporated herein by reference.

FIELD

Embodiments described herein relate generally to an integrated circuit, a test method for testing the integrated circuit, and an electronic device.

BACKGROUND

Field programmable gate arrays (FPGAs) are integrated circuits capable of performing a logic function. An FPGA includes logic blocks (LBs) capable of implementing desired logic information, and switch blocks (SBs) for switching the wiring line connection between the logic blocks. A logic block includes at least one look-up table (LUT) circuit (hereinafter also referred to as "LUT circuit"), which outputs a value stored in a memory in response to an input. A function to switch wiring lines may be given to the LUT circuit rewriting the data stored in the memory.

A switch block switches the connection between wiring lines, and thus have a function as a multiplexer circuit (hereinafter also referred to as "MUX circuit") to select one of a plurality of input terminals and to connect the selected input terminal to an output terminal. Which input terminal is connected is determined by the value of a configuration memory included in the switch block.

If the configuration memory included in the switch block is a one-time programmable (OTP) memory, it is difficult to check the operation of each circuit before data is written. Furthermore, if a test pattern is written during a test stage, no data can be additionally written by users.

DETAILED DESCRIPTION

An integrated circuit according to an embodiment includes: a first logic circuit configured to first implement logic information; and a first switch circuit configured to enable switching of wiring lines connected to the first logic circuit, the first logic circuit including: a first memory; a first look-up table circuit having a first output terminal for outputting data stored in the first memory based on an input signal; a first selection circuit having a first input terminal to which the first output terminal is connected, a second input terminal that receives scan input data, and a second output terminal, the first selection circuit being configured to select one of the first input terminal and the second input terminal based on a scan enable signal and connect selected one of the first input terminal and the second input terminal to the second output terminal; a first flip-flop having a third input terminal connected to the second output terminal and a third output terminal; and a second selection circuit having a fourth input terminal connected to the third output terminal, a fifth input terminal connected to the first output terminal, and a fourth output terminal, the second selection circuit being configured to select one of the fourth input terminal and the fifth input terminal based on an enable signal and connect selected one of the fourth input terminal and the fifth input terminal to the fourth output terminal, the first switch circuit performing the switching of the wiring lines in response to signals from the third output terminal and the fourth output terminal.

First Embodiment

Figure 1:
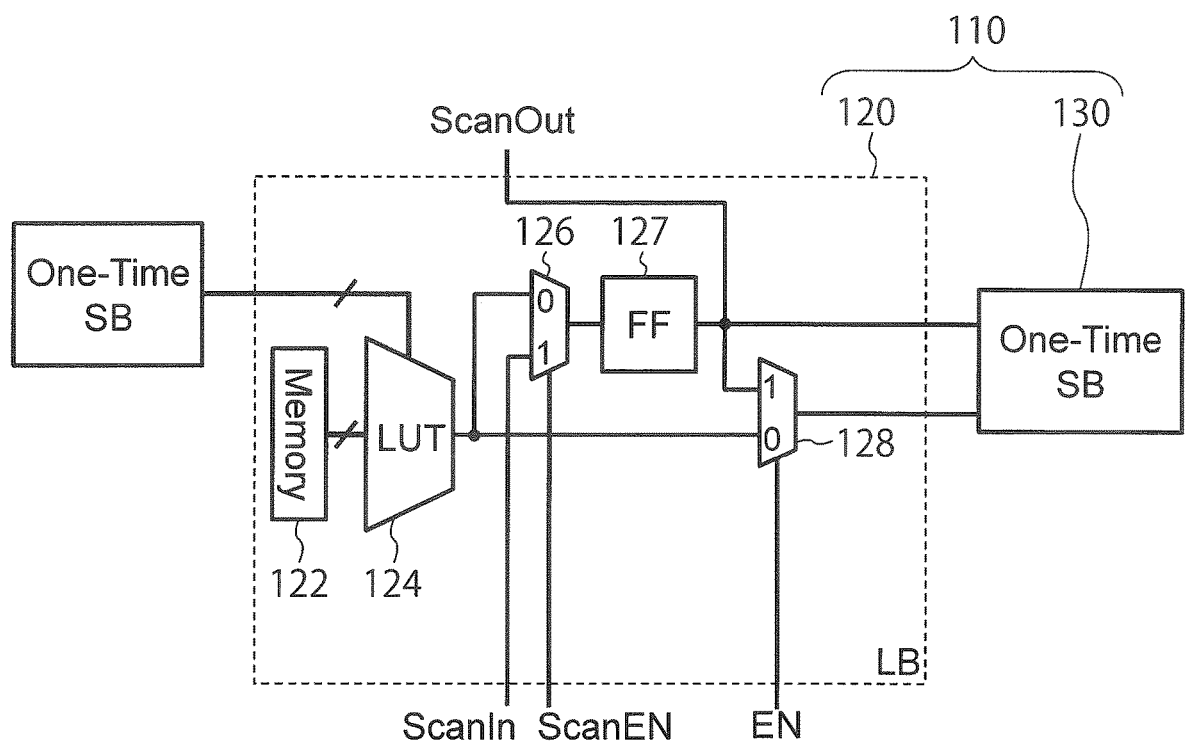
FIG. 1 is a block diagram of an integrated circuit according to a first embodiment.

An integrated circuit according to a first embodiment of the present invention will be described below with reference to the accompanying drawings. The integrated circuit according to the first embodiment is a field programmable gate array (FPGA) including at least one basic block (also called "basic tile") 110. The basic block 110 includes a logic block (LB) 120 and a switch block (SB) 130, as shown in FIG. 1. The integrated circuit generally includes a plurality of basic blocks 110 arranged in an array form.

(Logic Block)

The logic block 120 includes a configuration memory (hereinafter also referred to as "memory") 122, a look-up table circuit ("LUT circuit") 124, a multiplexer (selection circuit) 126, a flip-flop ("FF") 127, and a multiplexer (selection circuit) 128. The LUT circuit 124 selects and outputs data stored in the memory 122 based on an input signal from the switch block 130 included in another basic block (for example, the basic block on the left side of the basic block shown in FIG. 1). A preferable function may be given to the LUT circuit 124 by rewriting the data stored in the memory 122.

Figure 2:
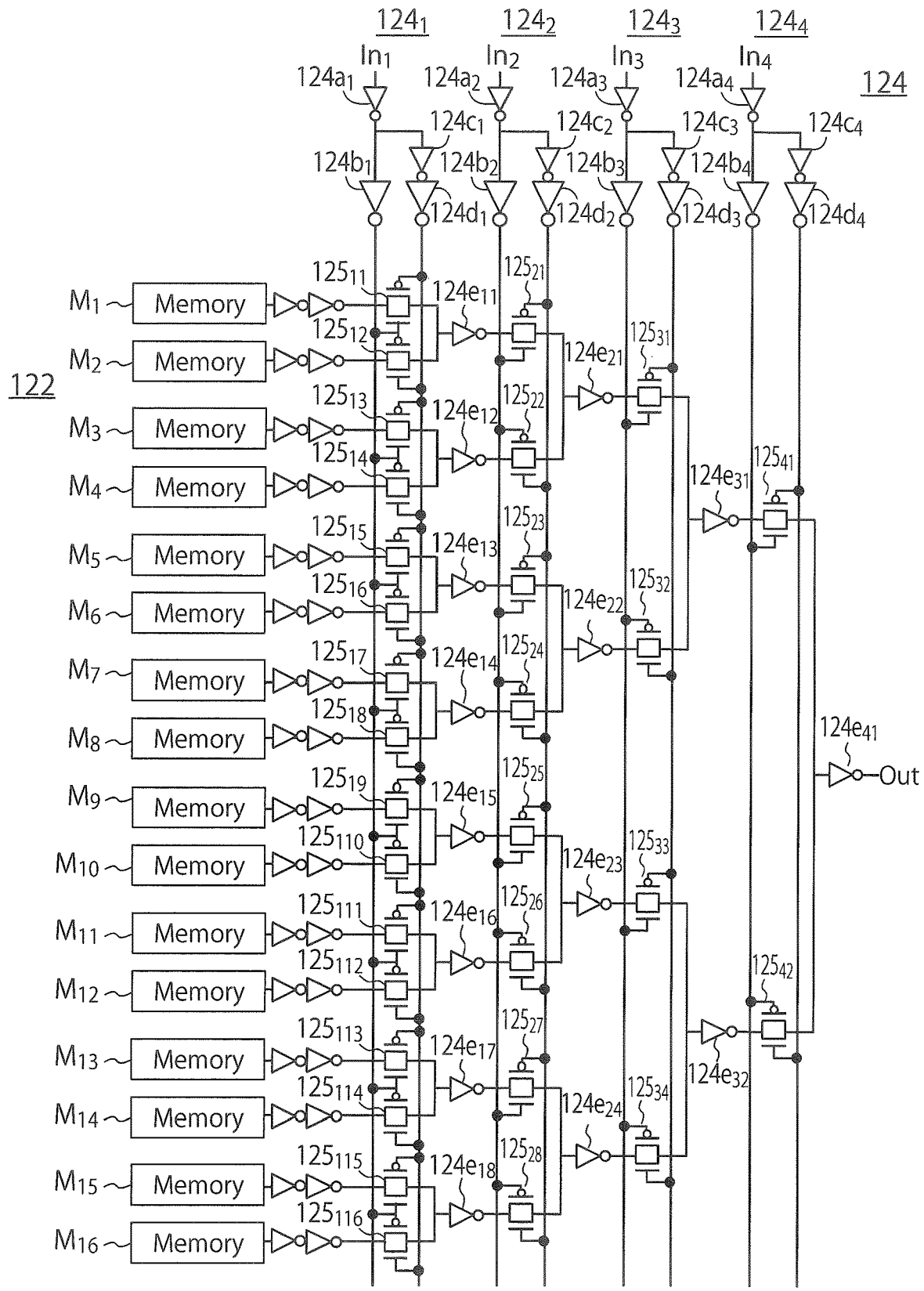
FIG. 2 is a circuit diagram illustrating an example of a logic block included in the integrated circuit according to the first embodiment.

FIG. 2 shows a specific example of the LUT circuit 124. The LUT circuit 124 of the specific example outputs a value stored in the memory 122 based on four input signals $In_1$ to $I_4$. The memory 122 includes sixteen memories $M_1$ to $M_{16}$ as shown in FIG. 2. Each memory $M_i$ (i=1, . . . , 16) stores data "0" or data "1."

The LUT circuit 124 includes four selection circuits $124_1$ to $124_4$. The selection circuit $124_1$ includes four inverters $124a_1$, $124b_1$, $124c_1$, and $124d_1$, sixteen transfer gates $125_{11}$ to $125_{116}$, and eight inverters $124e_{11}$ to $124e_{18}$. The inverter $124a_1$ receives the input signal $In_1$. The input terminal of each of the inverters $124b_1$ and $124c_1$ is connected to the output terminal of the inverter $124a_1$. The input terminal of the inverter $124d_1$ is connected to the output terminal of the inverter $124c_1$.

The transfer gate $125_{1i}$ (i=1, . . . , 16) includes a p-channel MOS transistor and an n-channel MOS transistor. The input terminal of the transfer gate $125_{1i}$ is connected to the output terminal of the memory $M_i$. In the transfer gate $125_{1i}$ (i=1, 3, 5, . . . , 15), the gate of the p-channel transistor is connected to the output terminal of the inverter $124d_1$, and the gate of the n-channel transistor is connected to the output terminal of the inverter $124b_1$. In the transfer gate $125_{1i}$ (i=2, 4, 6, . . . , 16), the gate of the p-channel transistor is connected to the output terminal of the inverter $124b_1$, and the gate of the n-channel transistor is connected to the output terminal of the inverter $124d_1$.

The output terminal of each of the transfer gates $125_{11}$ and $125_{12}$ is connected to the input terminal of the inverter $124e_{11}$. The output terminal of each of the transfer gates $125_{13}$ and $125_{14}$ is connected to the input terminal of the inverter $124e_{12}$. The output terminal of each of the transfer gates $125_{15}$ and $125_{16}$ is connected to the input terminal of the inverter $124e_{13}$. The output terminal of each of the transfer gates $125_{17}$ and $125_{18}$ is connected to the input terminal of the inverter $124e_{14}$. The output terminal of each of the transfer gates $125_{19}$ and $125_{110}$ is connected to the input terminal of the inverter $124e_{15}$. The output terminal of each of the transfer gates $125_{111}$ and $125_{112}$ is connected to the input terminal of the inverter $124e_{16}$. The output terminal of each of the transfer gates $125_{113}$ and $125_{114}$ is connected to the input terminal of the inverter $124e_{17}$. The output terminal of each of the transfer gates $125_{115}$ and $125_{116}$ is connected to the input terminal of the inverter $124e_{18}$.

The selection circuit $124_2$ includes four inverters $124a_2$, $124b_2$, $124c_2$, and $124d_2$, eight transfer gates $125_{21}$ to $125_{28}$, and four inverters $124e_{21}$ to $124e_{24}$. The inverter $124a_2$ receives the input signal $In_2$. The input terminal of each of the inverters $124b_2$ and $124c_2$ is connected to the output terminal of the inverter $124a_2$. The input terminal of the inverter $124d_2$ is connected to the output terminal of the inverter $124c_2$.

The transfer gate $125_{2i}$ (i=1, . . . , 8) includes a p-channel MOS transistor and an n-channel MOS transistor. The input terminal of the transfer gate $125_{2i}$ is connected to the output terminal of the inverter $124e_{1i}$. In the transfer gate $125_{2i}$ (i=1, 3, 5, 7), the gate of the p-channel transistor is connected to the output terminal of the inverter $124d_2$, and the gate of the n-channel transistor is connected to the output terminal of the inverter $124b_2$. In the transfer gate $125_{2i}$ (i=2, 4, 6, 8), the gate of the p-channel transistor is connected to the output terminal of the inverter $124b_2$, and the gate of the n-channel transistor is connected to the output terminal of the inverter $124d_2$. The output terminal of each of the transfer gates $125_{21}$ and $125_{22}$ is connected to the input terminal of the inverter $124e_{21}$. The output terminal of each of the transfer gates $125_{23}$ and $125_{24}$ is connected to the input terminal of the inverter $124e_{22}$. The output terminal of each of the transfer gates $125_{25}$ and $125_{26}$ is connected to the input terminal of the inverter $124e_{23}$. The output terminal of each of the transfer gates $125_{27}$ and $125_{28}$ is connected to the input terminal of the inverter $124e_{24}$.

The selection circuit $124_3$ includes four inverters $124a_3$, $124b_3$, $124c_3$, and $124d_3$, four transfer gates $125_{31}$ to $125_{34}$, and two inverters $124e_{31}$ and $124e_{32}$. The inverter $124a_3$ receives the input signal $In_3$. The input terminal of each of the inverters $124b_3$ and $124c_3$ is connected to the output terminal of the inverter $124a_3$. The input terminal of the inverter $124d_3$ is connected to the output terminal of the inverter $124c_3$.

The transfer gate $125_{3i}$ (i=1, . . . , 4) includes a p-channel MOS transistor and an n-channel MOS transistor. The input terminal of the transfer gate $125_{3i}$ is connected to the output terminal of the inverter $124e_{2i}$. In the transfer gate $125_{3i}$ (i=1, 3), the gate of the p-channel transistor is connected to the output terminal of the inverter $124d_3$, and the gate of the n-channel transistor is connected to the output terminal of the inverter $124b_3$. In the transfer gate $125_{3i}$ (i=2, 4), the gate of the p-channel transistor is connected to the output terminal of the inverter $124b_3$, and the gate of the n-channel transistor is connected to the output terminal of the inverter $124d_3$. The output terminal of each of the transfer gates $125_{31}$ and $125_{32}$ is connected to the input terminal of the inverter $124e_{31}$. The output terminal of each of the transfer gates $125_{33}$ and $125_{34}$ is connected to the input terminal of the inverter $124e_{32}$.

The selection circuit $124_4$ includes four inverters $124a_4$, $124b_4$, $124c_4$, and $124d_4$, two transfer gates $125_{41}$ and $125_{42}$, and one inverter $124e_{41}$. The inverter $124a_4$ receives the input signal $In_4$. The input terminal of each of the inverters $124b_4$ and $124c_4$ is connected to the output terminal of the inverter $124a_4$. The input terminal of the inverter $124d_4$ is connected to the output terminal of the inverter $124c_4$.

The transfer gate $125_{4i}$ (i=1, 2) includes a p-channel MOS transistor and an n-channel MOS transistor. The input terminal of the transfer gate $125_{4i}$ is connected to the output terminal of the inverter $124e_{3i}$. In the transfer gate $125_{41}$, the gate of the p-channel transistor is connected to the output terminal of the inverter $124d_4$, and the gate of the n-channel transistor is connected to the output terminal of the inverter $124b_4$. In the transfer gate $125_{42}$, the gate of the p-channel transistor is connected to the output terminal of the inverter $124b_4$, and the gate of the n-channel transistor is connected to the output terminal of the inverter $124d_4$. The output terminal of each of the transfer gates $125_{41}$ and $125_{42}$ is connected to the input terminal of the inverter $124e_{41}$. The output terminal of the inverter $124e_{41}$ serves as the output terminal of the LUT circuit 124, which is connected to one of two input terminals of the multiplexer (selection circuit) 126 and one of the two input terminals of the multiplexer (selection circuit) 128 as shown in FIG. 1.

The selection circuit 126 receives a scan input signal ScanIn at the other of the two input terminals as shown in FIG. 1. The selection circuit 126 selects one of the output from the LUT circuit 124 and the scan input signal ScanIn based on a scan enable signal ScanEN, and sends the selected signal to the flip-flop 127. In scan mode, the flip-flop 127 outputs a scan output signal ScanOUT to the outside of the logic block 120. The output terminal of the flip-flop 127 is connected to the switch block 130 of the same basic block 110, and one of the two input terminals of the selection circuit 128.

The other of the two input terminals of the selection circuit 128 is connected to the output terminal of the LUT circuit 124. Thus, the selection circuit 128 selects either the output of the LUT circuit 124 or the output of the flip-flop 127 based on an enable signal EN, and sends the selected signal to the switch block 130 that is included in the same basic block as the logic block 120.

(Operation of Logic Block)

The operations in the normal mode and the test mode of the logic block 120 will be described with reference to FIG. 1.

In the normal mode, a value, for example "0," is given to the enable signal EN. The selection circuit 128 then selects the output of the LUT circuit 124, and sends the selected output to the switch block 130 included in the same basic block 110.

In the test mode, a value, for example "1," is given to the enable signal EN. If a value, for example "1," is given to the scan enable signal ScanEN, the selection circuit 126 selects the scan input signal ScanIn inputted as scan data and sends the selected signal to the flip-flop 127. Clock operation is performed to correspond to the number of logic blocks between the scan input signal ScanIn and the scan output signal ScanOut, and the scan output signal ScanOut is sent to another basic block. After data is sent to the flip-flop 127, the value "0" is given to the scan enable signal ScanEN to end the one clock operation of the test mode. At this time, the output of the flip-flop 127 is sent to the switch block 130 included in the same basic block as the logic block via the selection circuit 128. The output from a flip-flop included in another basic block is inputted to the LUT circuit 124 included in the logic block 120 via one or more switch blocks, for example a switch block 130 included in a basic block on the left side of the basic block 120 shown in FIG. 1, and based on this input, the data of the memory 122 is sent to the flip-flop 127 via the selection circuit 126.

(Switch Block)

Figure 3:
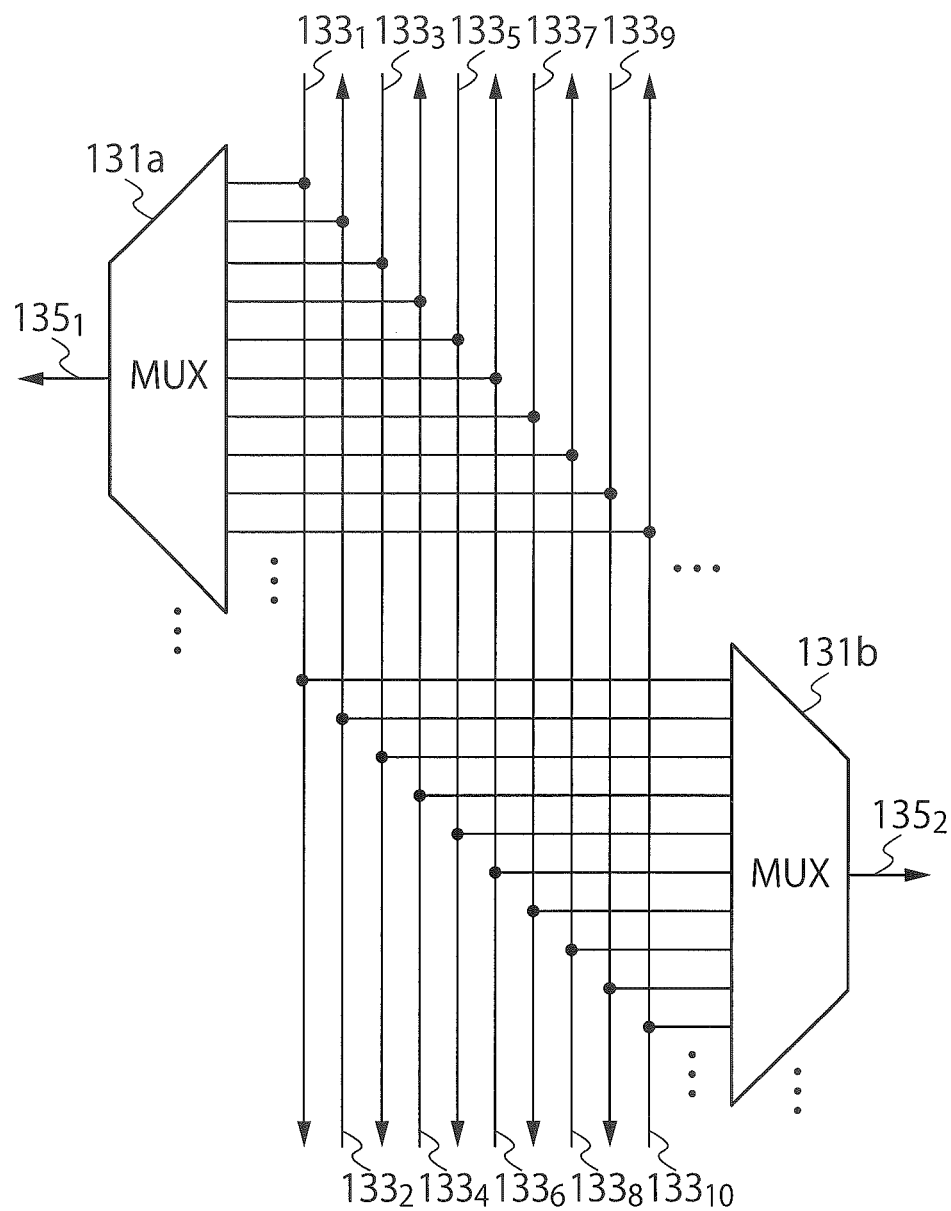
FIG. 3 is a circuit diagram illustrating a first example of a switch block included in the integrated circuit according to the first embodiment.

The switch block 130 includes a plurality of multiplexer circuits ("MUX circuits"). An example of the switch block 130 is shown in FIG. 3. The switch block 130 includes two MUX circuits 131*a* and 131*b*, each of which selects one of a plurality of input terminals each connected to one of a plurality of wiring lines 133$_1$ to 133$_{10}$, and connects the selected input terminal to the output terminal connected to a wiring line 135$_1$ or a wiring line 135$_2$. Thus, the switch block 130 includes a plurality of output terminals.

Figure 4:
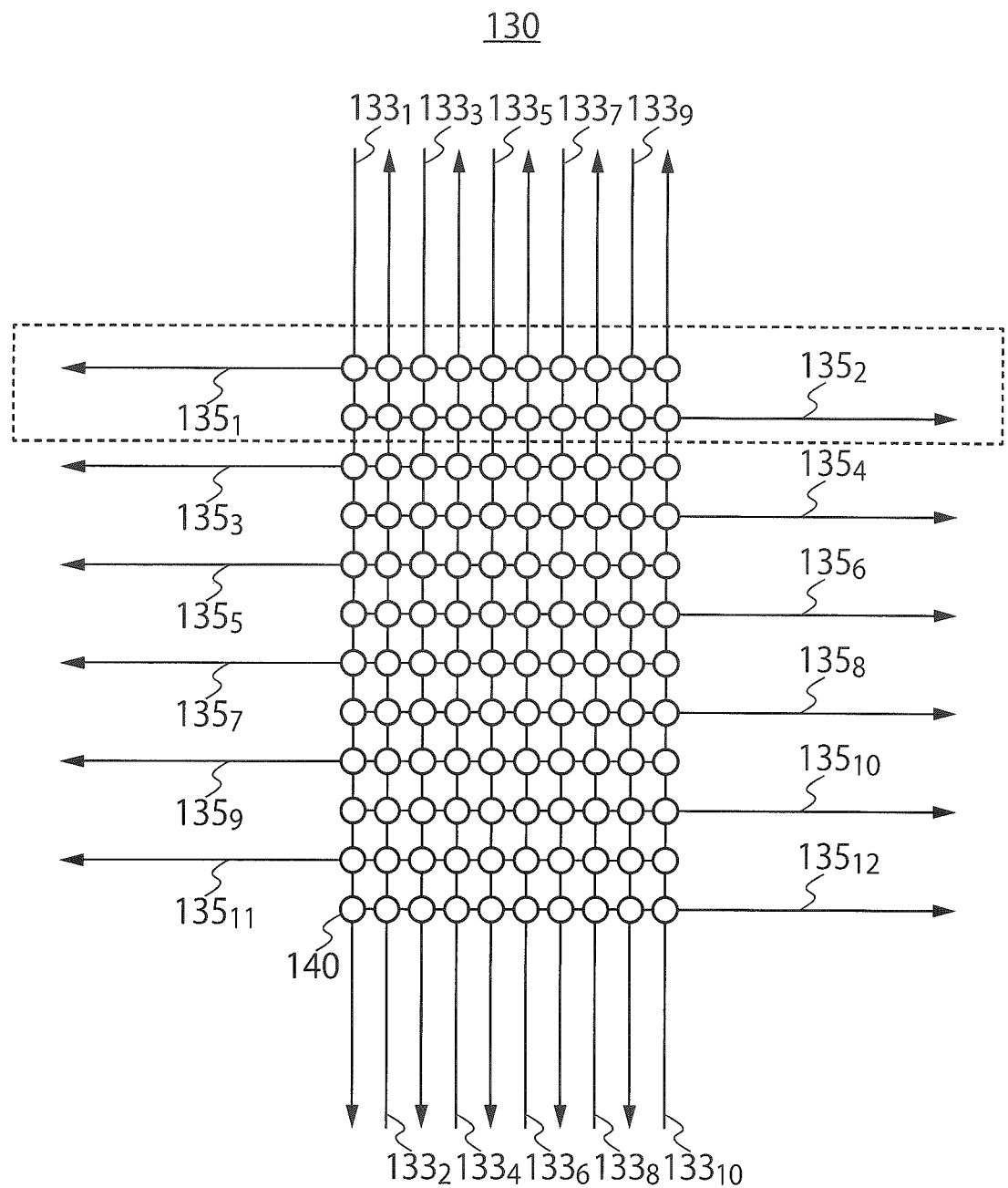
FIG. 4 is a circuit diagram illustrating a second example of the switch block included in the integrated circuit according to the first embodiment.

FIG. 4 shows another example of the switch block 130. The switch block 130 shown in FIG. 4 includes a plurality of switch circuits 140 arranged in a matrix form. The switch circuits 140 arranged in the same row are connected to a single output wiring line. For example, in FIG. 4, the switch circuits 140 arranged in the (2i−1)th (i=1, . . . , 6) row from the top are connected to a row wiring line 135$_{2i-1}$, a signal on which is sent from right to left in FIG. 4, and the switch circuits 140 arranged in the 2i-th row are connected to a row wiring line 135$_{2i}$, a signal on which is sent from left to right in FIG. 4. The switch circuits 140 arranged in the 2(j−1)th (j=1, . . . , 5) column from the left are connected to a column wiring line 133$_{2j-1}$, and the switch circuits 140 arranged in the 2j-th row are connected to a column wiring line 133$_{2j}$. In other words, each switch circuit 140 is disposed between an intersection region of one of the wiring lines 133$_1$ to 133$_{10}$ and one of the row wiring lines 135$_1$ to 135$_{12}$ and determines whether the corresponding one of the wiring lines 133$_1$ to 133$_{10}$ and the corresponding one of the row wiring lines 135$_1$ to 135$_{12}$ need to be connected to each other. The switch circuits 140 arranged in the first row from the top functions in the same manner as the MUX circuit 131*a* shown in FIG. 3, and the switch circuits 140 arranged in the second row from the top functions in the same manner as the MUX circuit 131*b*.

As described above, all the inputs of the switch block 130 shown in FIG. 4 may be arbitrarily connected to all the outputs. The switch block that is arranged at an intersection region between wiring lines, has a switch circuit, and is capable of connecting all of its inputs to all of its output is called cross-point switch block.

MUX circuits using complementary metal-oxide semiconductor (CMOS) transistors are also known. However, an increase in area relative to an increase in the number of inputs is considerably large in a MUX circuit. Therefore, some designs employ an architecture in which signals are decimated before being inputted to any of the switch blocks, and thus no MUX circuit is used.

The increase in area may be curbed by using a two-terminal switching element such as a resistive change element or an anti-fuse element. The resistive change element may be a magnetic tunnel junction (MTJ) element, a redox-type resistive change element, and ion-conductive type resistive change element, or a phase-change element, for example. The anti-fuse element may be a one-time programmable (OTP) element such as a gate oxide film breaking-type transistor.

Figure 5:
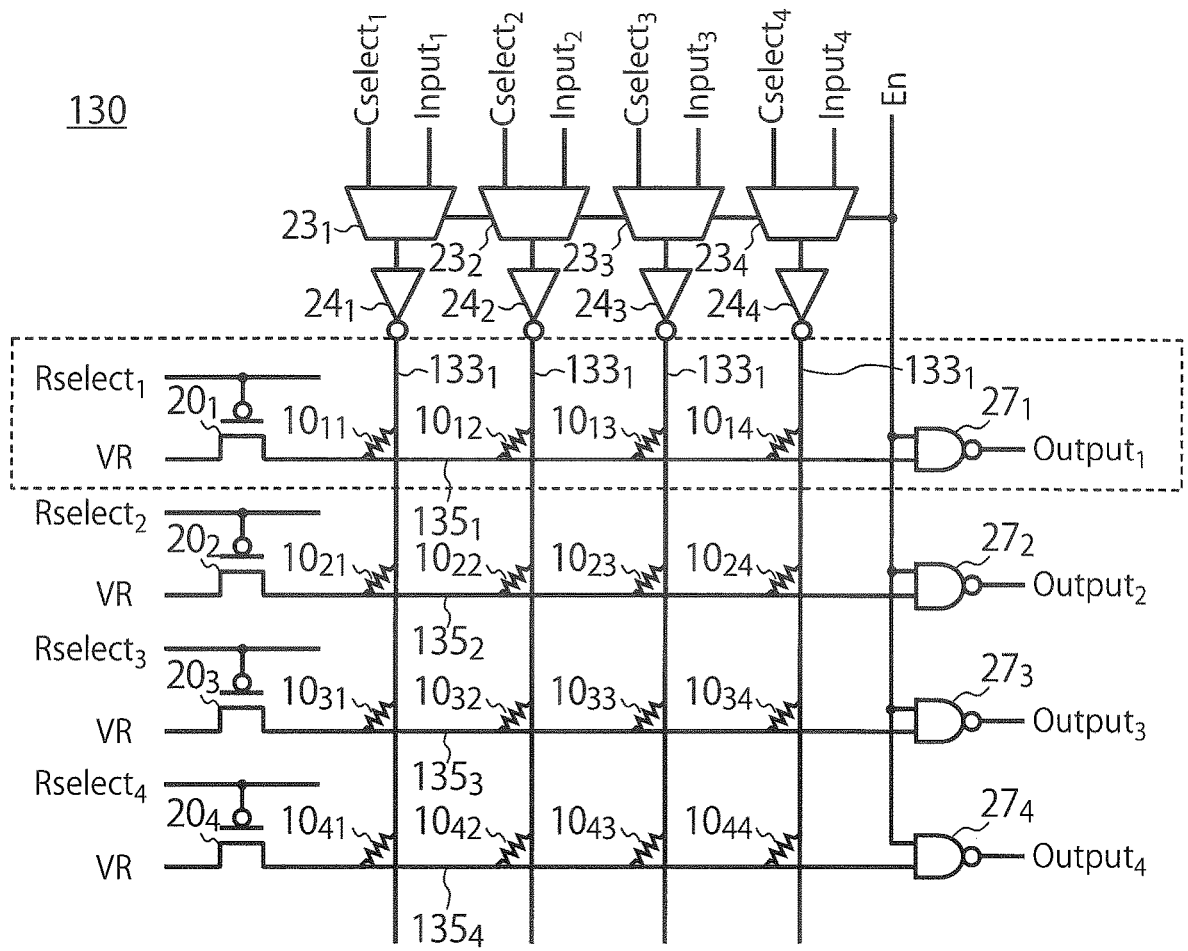
FIG. 5 is a circuit diagram illustrating a third example of the switch block included in the integrated circuit according to the first embodiment.

FIG. 5 shows a specific example of a cross-point switch block including two-terminal switching elements serving as switch circuits. The switch block 130 includes two-terminal switching elements 10$_{ij}$ (i, j=1, 2, 3, 4), p-channel transistors 20$_1$ to 20$_4$, multiplexers (selection circuits) 23$_1$ to 23$_4$, inverters 24$_1$ to 24$_4$, and NAND gates 27$_1$ to 27$_4$.

The selection circuit 23$_j$ (j=1, . . . , 4) selects one of a selection signal Cselect$_j$ and an input signal Input$_j$ inputted to its two input terminals based on an enable signal En, and sends the selected signal to the inverter 24$_j$. The output terminal of the inverter 24$_j$ (j=1, . . . , 4) is connected to a column wiring line 133$_j$.

The two-terminal switching element 10$_{ij}$ (i, j=1, 2, 3, 4) is disposed in an intersection region between the column wiring line 133$_j$ and a row wiring line 135$_i$. One of the two terminals of the two-terminal switching element 10$_{ij}$ is connected to the column wiring line 133$_j$ and the other is connected to the row wiring line 135$_i$.

One of the source and the drain of the transistor 20$_i$ (i=1, 2, 3, 4) is connected to the row wiring line 135$_i$, the other receives a signal VR$_i$, and the gate receives a row selection signal Rselect$_i$. One of the input terminals of the NAND gate 27$_i$ (i=1, . . . , 4) receives the enable signal En, the other is connected to the row wiring line 133$_i$, and the output terminal outputs an output signal Output$_i$.

An example of the write operation of the switch block 130 having the above-described structure will be described with reference to FIG. 6. The write operation is performed on the switching element 10$_{11}$. A voltage to turn on the transistor 20$_1$, for example Vss, is given to the row selection signal Rselect$_1$. The enable signal En is activated, a high potential (Vdd) is given to the column selection signal Cselect$_1$, and a low potential (VC$_1$) is given to the column wiring line 133$_1$ via the inverter 24$_1$. A write voltage VR$_1$ is then given to the source of the transistor 20$_1$ that is in the ON state. The voltage VC$_1$ applied to the column wiring line 133$_1$ makes the voltage applied across the switching element 10$_{11}$ (=VR$_1$−VC$_1$) higher than the threshold of the voltage for turning on the switching element 10$_{11}$, and may be expressed as follows:

$$\text{Threshold Voltage} < VR_1 - VC_1$$

Data is written to the switching element 10$_{11}$ in this manner. A write prevention voltage Vinhibit is applied across each of the other switching elements to prevent erroneous writing to the switching elements other than the target switching element. The write prevention voltage Vinhibit meets the following conditions:

Threshold Voltage>$VR_1$-Vinhibit

Threshold Voltage>Vinhibit-$VC_1$

Figure 6:
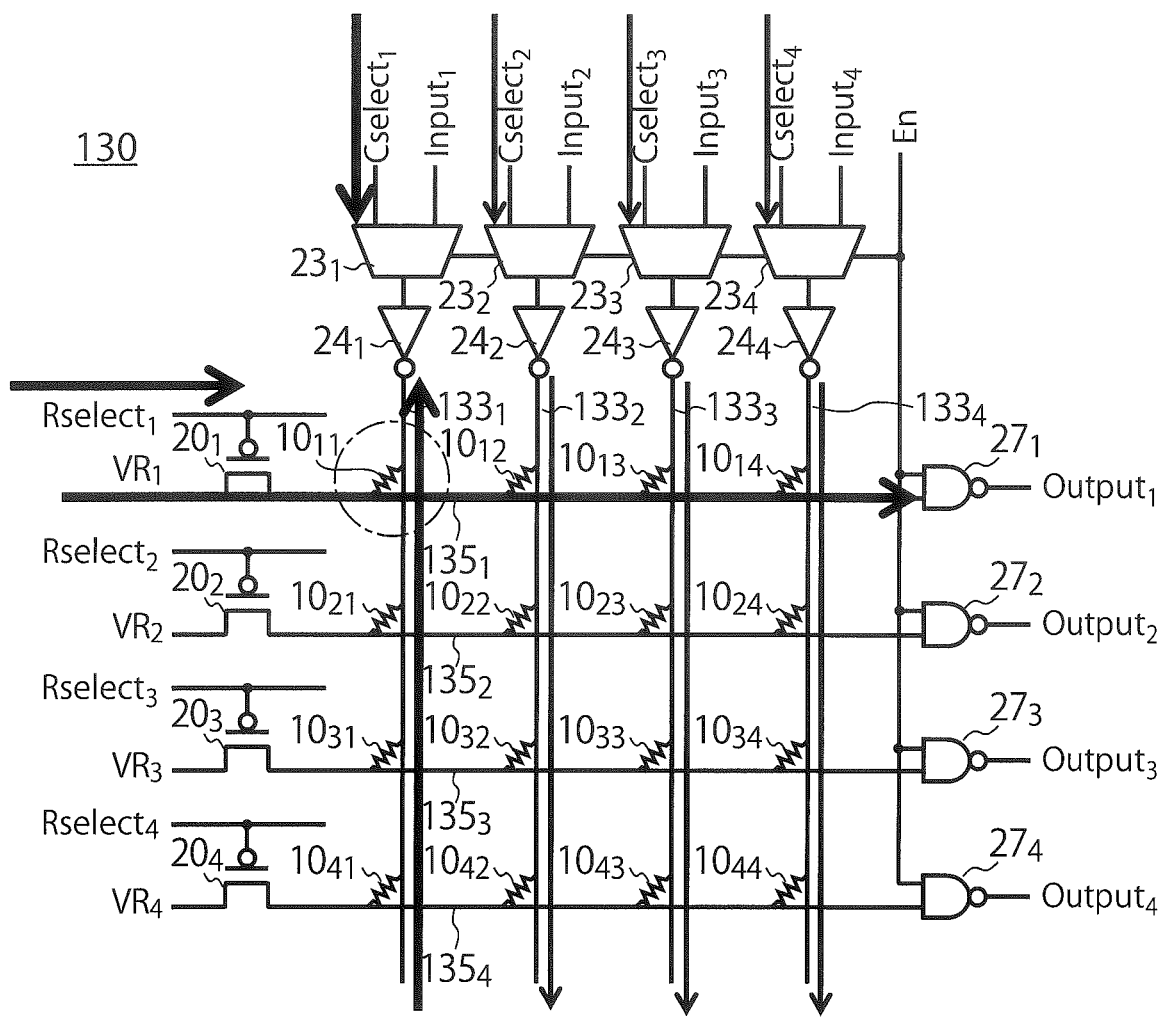
FIG. 6 is a diagram for explaining the operation of the switch block shown in FIG. 5.

In the specific example shown in FIG. 6, the write prevention voltage Vinhibit may be a power supply voltage Vdd on the high side of the inverter circuit $24_i$, (i=1, 2, 3, 4).

If the write voltage $VR_i$ (i=1, . . . , 4) is higher than the gate breakdown voltage of the transistors, peripheral circuits to which the write voltage $VR_i$ may be applied during the memory write operation may be broken. In order to avoid this, the NAND gate $27_i$ is connected to the row wiring line $135_i$ (i=1, . . . , 4) as shown in FIG. 6.

Figure 7:
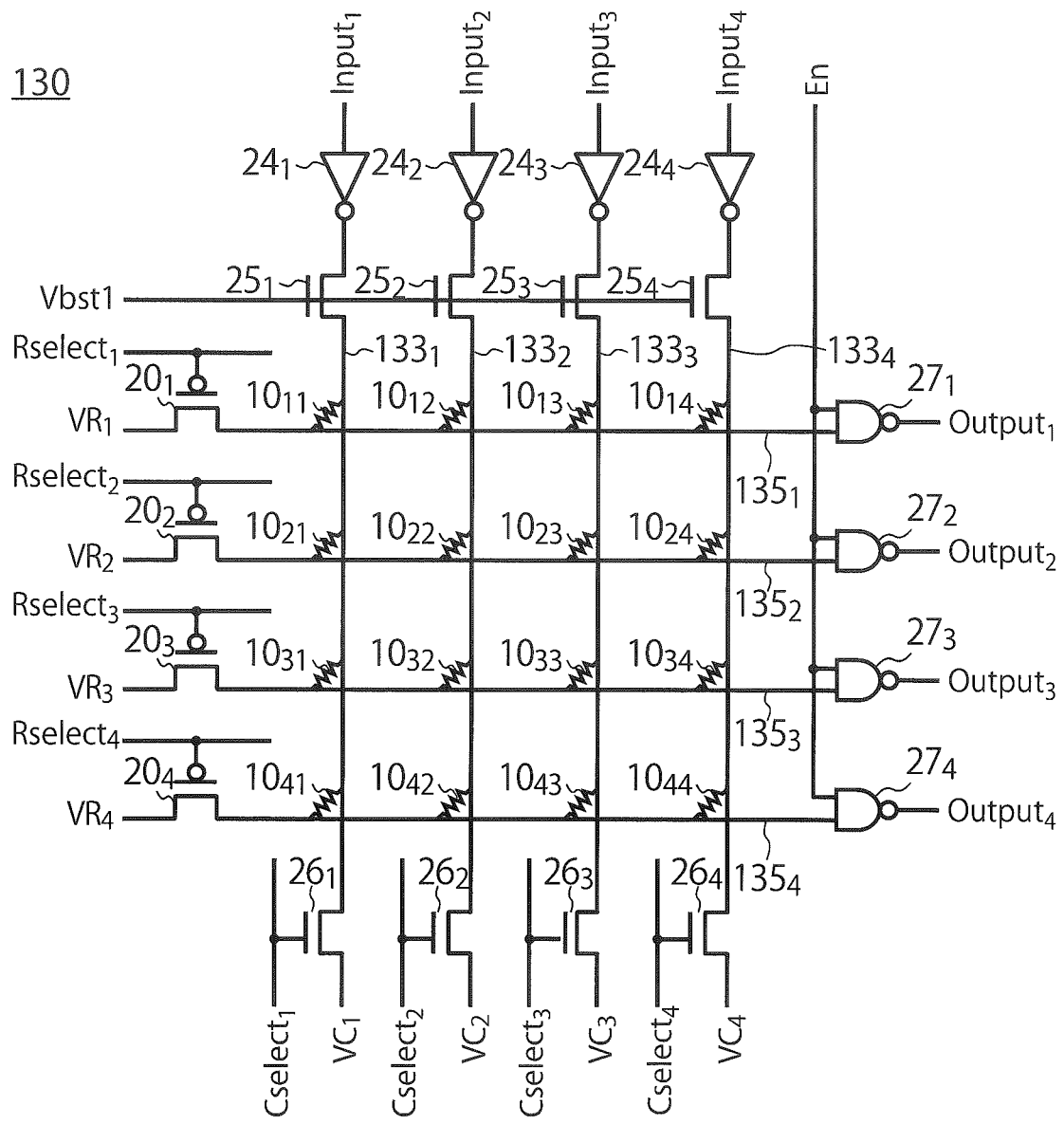
FIG. 7 is a circuit diagram illustrating a fourth example of the switch block included in the integrated circuit according to the first embodiment.

If the value of the write prevention voltage Vinhibit should be higher than the value of the power supply voltage Vdd on the high side of the inverter circuit $24_i$, (i=1, 2, 3, 4), The selection signal and the input signal may be processed by different circuits as shown in FIG. 7. FIG. 7 shows a switch block 130 obtained by providing an n-channel transistor $25_j$ instead of the selection circuit $23_j$ (j=1, . . . , 4) and also providing an n-channel transistor $26_j$ to the switch block 130 shown in FIG. 5. The n-channel transistor $25_j$ (j=1, . . . , 4) is disposed between the output terminal of the inverter $24_j$ and the column wiring line $133_j$, and the n-channel transistor $26_j$ (j=1, . . . , 4) is disposed on the opposite side of the n-channel transistor $25_j$ relative to the column wiring line $133_j$. A voltage Vbst1 is applied to the gate of the n-channel transistor $25_j$ (j=1, . . . , 4). The column selection signal $Cselect_3$ is received at the gate of the n-channel transistor $26_j$ (j=1, . . . , 4), and the voltage $VC_3$ is applied to the source thereof.

Figure 8:
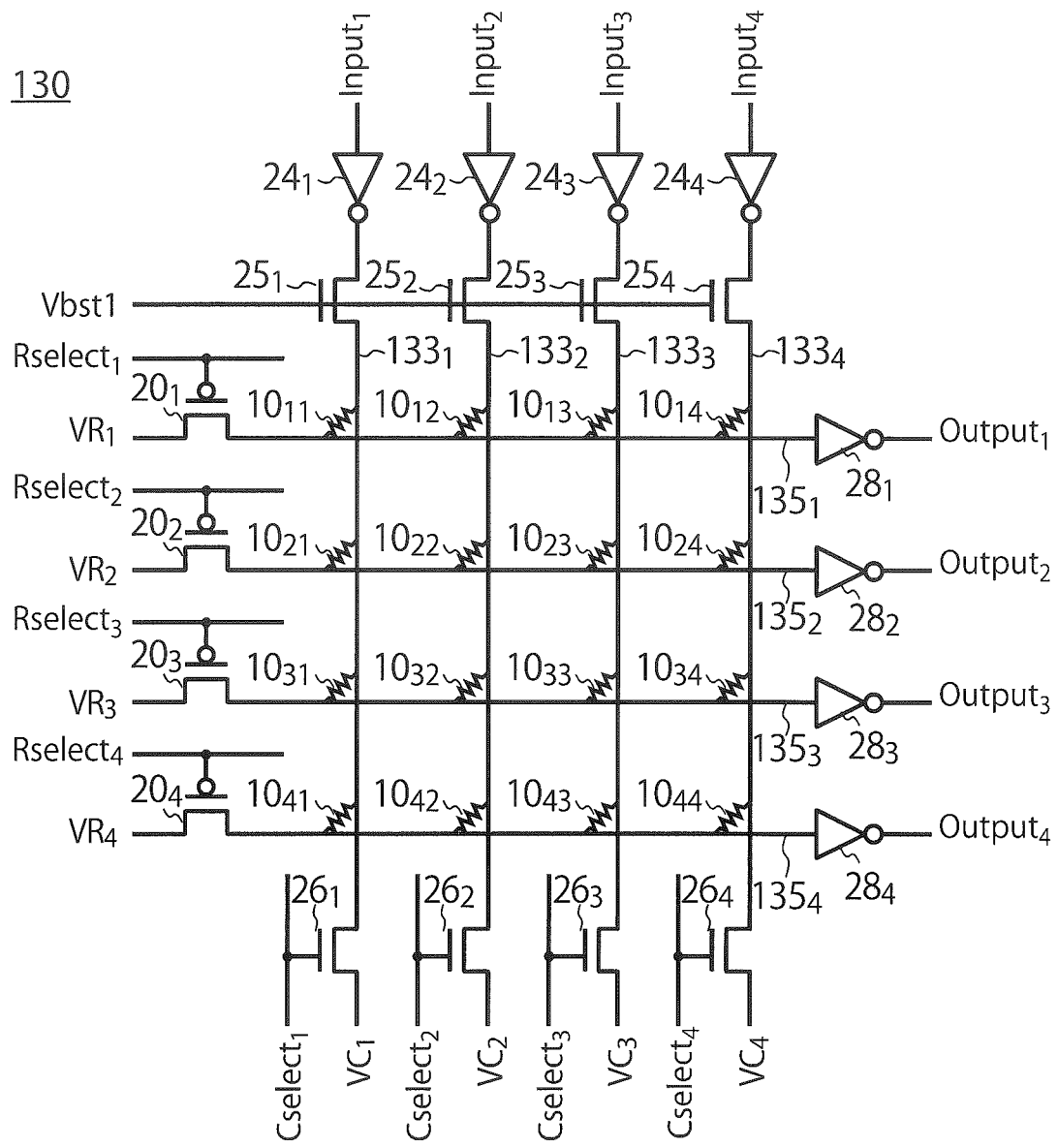
FIG. 8 is a circuit diagram illustrating a fifth example of the switch block included in the integrated circuit according to the first embodiment.

If a write voltage VR to be used has a value that may not break standard CMOS circuits, a switch block 130 shown in FIG. 8 may be employed. The switch block 130 shown in FIG. 8 is obtained by using an inverter $28_i$ instead of the NAND gate $27_i$ (i=1, . . . , 4) in the switch block 130 shown in FIG. 7.

(Test Method)

Figure 9:
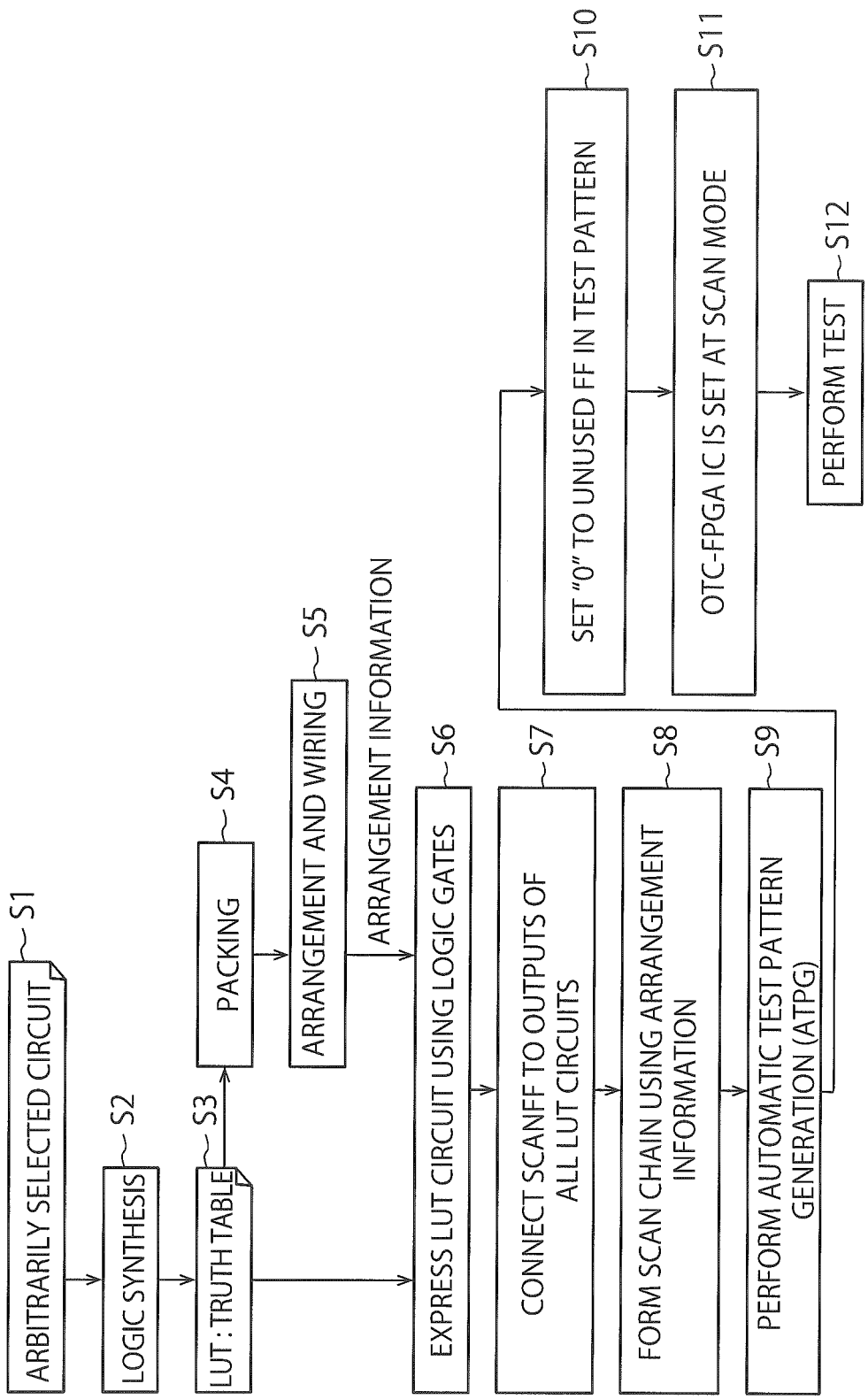
FIG. 9 is a flowchart of a test method for testing the integrated circuit according to the first embodiment.

A test method for testing the integrated circuit according to the first embodiment having the above-described configuration will be described with reference to FIGS. 9 to 12. FIG. 9 is a flow chart showing the procedure of the test method.

First, an arbitrarily selected circuit is set as an input, in which a hardware description language or a more abstract language converted to a hardware description language is used, (step S1).

Logic synthesis is performed for this circuit (step S2) to obtain a truth table group that may be set at a LUT circuit used as a basic logic function of an FPGA (step S3).

Packing is performed in accordance with the FPGA architecture using the truth table information (step S4), and the arrangement and the wiring line setting are performed to obtain FPGA mapping information (arrangement information) (step S5).

The processes of steps S6 to S8 are then performed using the truth tables and the arrangement information. First, the LUT circuit is expressed as using logic gates (step S6). The LUT circuit is, for example, the LUT circuit 124 shown in FIG. 2. An independent configuration memory 122 is connected to each of input patterns in the LUT circuit included in the FPGA. An arbitrary logic can be obtained by using the values from the respective memories. The logic gates of a LUT circuit differ from those of an application specific integrated circuit (ASIC) in that in order to perform operation tests on all of the circuits, all of the input patterns should be checked. The logic gate test for an ASIC is not necessarily the same. For example, if a logic gate is a two-input gate, it is not necessary to check all of the four patterns. The operation of the transistors included in the logic gate may be tested by checking fewer patterns. However, it cannot be said that a test of a one-time configurable (OTC)-FPGA including a LUT circuit with a two-input AND gate, for example, is completed even if a test pattern is created by an automatic test pattern generator (ATPG) using the two-input AND gate as the LUT circuit.

Figures 10A, 10B:
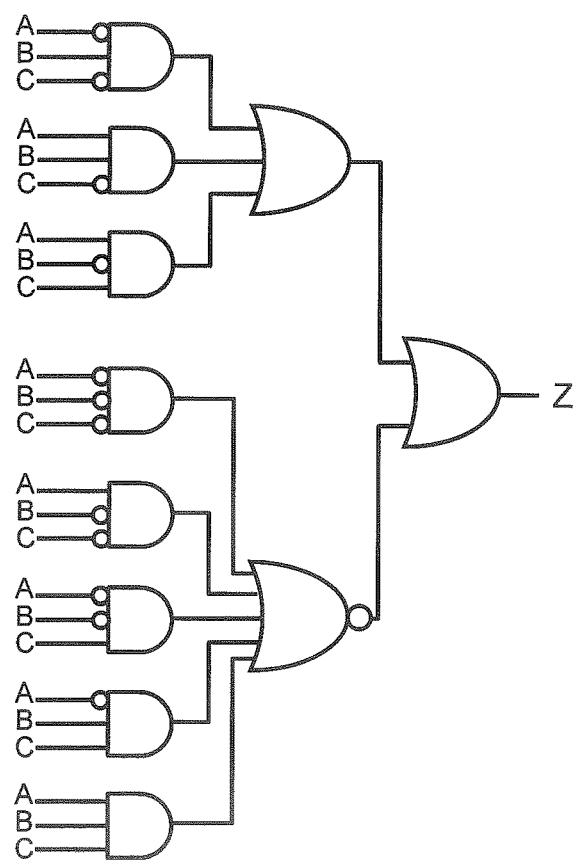
FIGS. 10A and 10B are diagrams for explaining a process of the test method shown in FIG. 9.

Therefore, the test method according to this embodiment forms a gate net shown in FIG. 10B with respect to all the patterns of a truth table shown in FIG. 10A, for example. As a result, the ATPG checks all of the gates and forms a pattern in which each row of the truth table is checked at least once. The LUT circuit is expressed using logic gates in this manner. If logic gates are formed (gate net is created) to check all of the patterns of the LUT circuit, the number of test patterns would become enormous.

Therefore, in this embodiment, the gate net is modified so that a scan FF is connected to each output of the LUT circuit (step S7). Since the FF is connected to the output of the LUT circuit included in the FPGA, the FF may be used in a scan mode, as will be described in the descriptions of step S11.

In the case of the ASIC, the connection of a scan FF is determined when the gate net is generated. Thereafter, the arrangement and the wiring line setting are performed, and data is inputted to the ATPG based on the arrangement information. This can be performed since the chip is formed after the arrangement and the wiring line setting.

In the case of the FPGA, however, the arrangement and the wiring line setting for writing the circuit information are performed after the manufacturing is complicated. Therefore, it may be possible that the connection of the scan FF does not match the hardware. In order to deal with this, a dedicated switch circuit for connecting a scan FF may be provided, or the connection of the scan FF may be performed later using a switch block that is also used for performing a logic in a normal operation. However, in both cases, the circuit area may be increased.

Figure 11:
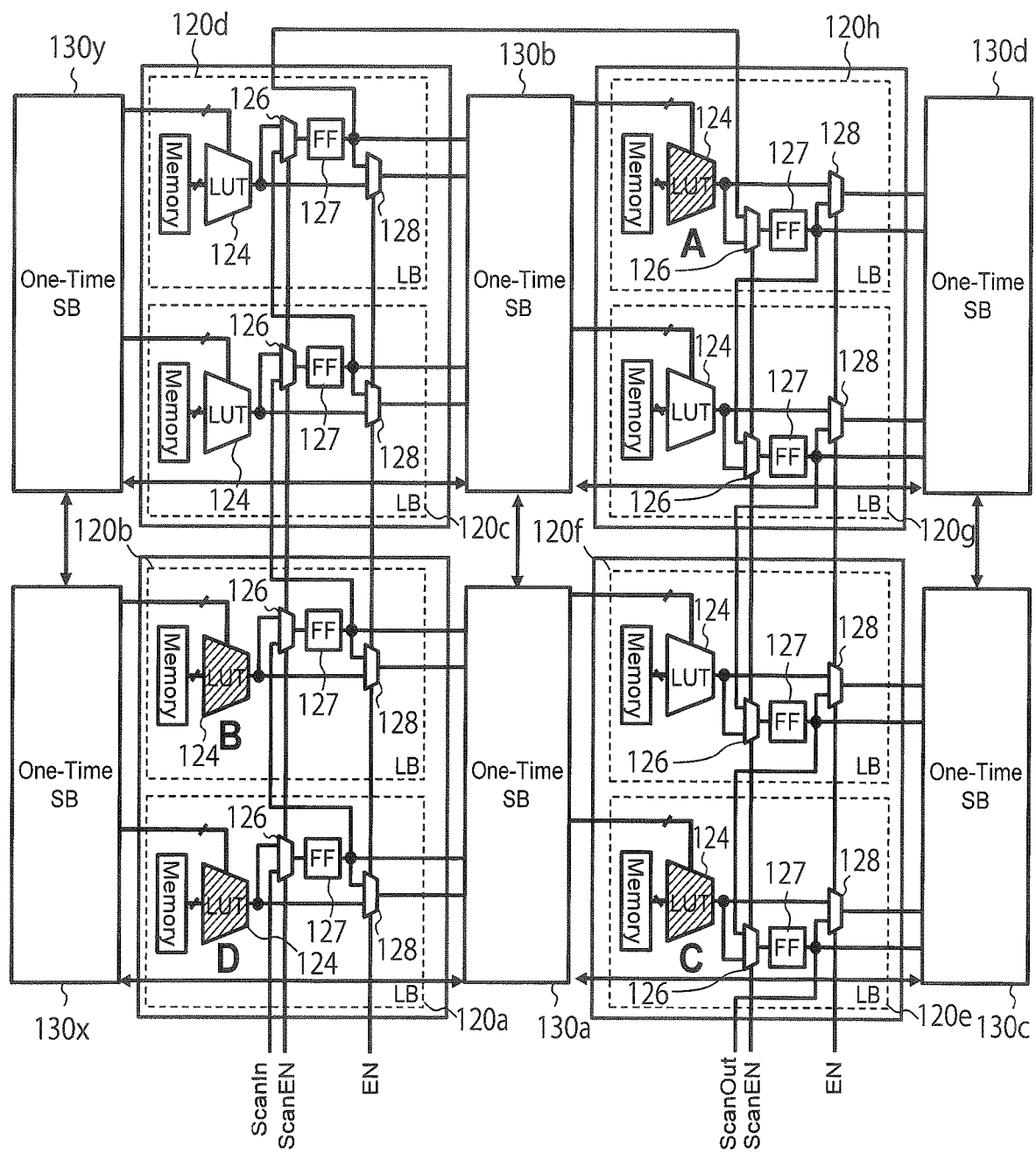
FIG. 11 is a diagram for explaining the procedure of the test method shown in FIG. 9.

By employing a process for forming a scan chain by connecting a scan FF using the arrangement information as in step S8, the ATPG may use the scan FF connection fixed during the manufacturing process. This step will be described with reference to FIG. 11 showing the connection of the respective blocks in the FPGA. FIG. 11 is a block diagram illustrating an example of an FPGA, which includes logic blocks 120a to 120h arranged in an array form, switch blocks 130a to 130d, and switch blocks 130x and 130y. Each of the logic blocks 120a to 120h has the same structure as the logic block shown in FIG. 1, and the flip-flop 127 included in each logic block serves as a scan FF. In FIG. 11, the logic blocks 120a and 120b vertically arranged. The switch block 130x is disposed on the input side and the switch block 130a is disposed on the output side of the logic blocks 120a and 120b. The logic blocks 120c and 120d are vertically disposed, and the switch block 130y is disposed on the input side and the switch block 130b is disposed on the output side of the logic blocks 120c and 120d. The logic blocks 120e and 120f are vertically arranged, and the switch block 130a is disposed on the input side, and the switch block 130c is disposed on the output side of the logic blocks 120e and 120f. The logic blocks 120g and 120h are vertically arranged, and the switch block 130b is disposed on the input side and the switch block 130d is disposed on the output side of the logic blocks 120g and 120h. For example, each of the switch blocks 130a to 130d and switch blocks 130x and 130y is the switch block shown in FIGS. 5 to 8, including a memory that can be written only once (one-time memory).

If a scan enable signal ScanEN is inputted to the selection circuit 126, the output terminal of which is connected to one of the two input terminals of the flip-flop 127 to select the scan input signal ScanIn in each of the logic blocks 120a to 120h, a shift register is formed between the input terminal to which the scan input signal ScanIn is inputted to a scan output terminal from which the scan output signal ScanOut is outputted in each logic circuit, as shown in FIG. 1. The shift register is on a continuous path between the output terminal of the flip-flop and the scan input terminal of the same basic tile for performing the same basis logic, to which the scan input signal is inputted, or the scan input terminal of an adjacent basic tile for performing another basic logic. For example, the shift register is on the path between the scan input terminal of the logic block 120a shown in FIG. 11 and the output terminal (scan output terminal) of the flip-flop 127 included in the logic block 120a or the output terminal (scan output terminal) of the flip-flop 127 included in the logic block 120b.

The scan input terminal and the scan output terminal of an FPGA is connected to each other as shown in FIG. 11 during the manufacturing process. LUT circuits 124 each having a truth table denoted by A, B, C, or D in the FPGA (such LUT circuits 124 are hatched in FIG. 11) are mapped on the respective positions in FIG. 11. After such arrangement information is obtained, the connection of the scan FFs in the gate net is changed in accordance with the actual hardware arrangement, i.e., the order of D, B, A, and C. The truth tables A, B, C, and D are mapped on the LUT circuit 124 included in the logic block 120h, the LUT circuit 124 included in the logic block 120b, the LUT circuit 124 included in the logic block 120e, and the LUT circuit 124 included in the logic block 120a. The ATPG generates a test pattern based on the connection information (step S9). The test pattern matches the hardware of the FPGA.

However, unlike the ASIC, the FPGA may include an unused block on the scan chain. The generated test pattern may need to be modified to deal with such a block. Specifically, in step S10, the value "0" is given to the block that will not be used. It may be possible that a dummy flip-flop is additionally given to the gate net. However, it would be rather difficult to provide the same number of dummy flip-flops as the number of blocks that will not be used, which are randomly located, using the arrangement information. The method in this embodiment, in which a scan flip-flop is always provided on the output terminal side of the LUT circuit, is relatively easy.

In the integrated circuit according to this embodiment, the value "0" is inserted to the generated test pattern. For example, in the FPGA shown in FIG. 11, since the scan chain is modified to have a path D, B, A, and C, the flip-flops 127 included in the logic blocks 120c, 120d, 120f, and 120g are not used. Therefore, the data "0" is inserted to necessary portions to modify the test pattern so that the value "0" is set at the unused flip-flops 127 (step S10). This value is not a fixed value, and the value "1" may be used instead.

After the modified test pattern is generated, the FPGA hardware is set to the test mode as shown in step S11, and a test is performed (step S12). Connecting a flip-flop on the output terminal side of each of the LUT circuits in the gate net can be achieved by the integrated circuit according to this embodiment shown in FIG. 1. Only in the test, the path in which the output terminal of the LUT circuit is directly connected to the switch block is changed by the selection circuit 126 to use the flip-flop 127.

As described above, the circuit operation test may be performed on an integrated circuit including one-time programmable memories. The test operation may be performed before the integrated circuit is shipped (before the circuit information is programmed) or after the circuit information is programmed by a user.

Second Embodiment

Figure 12:
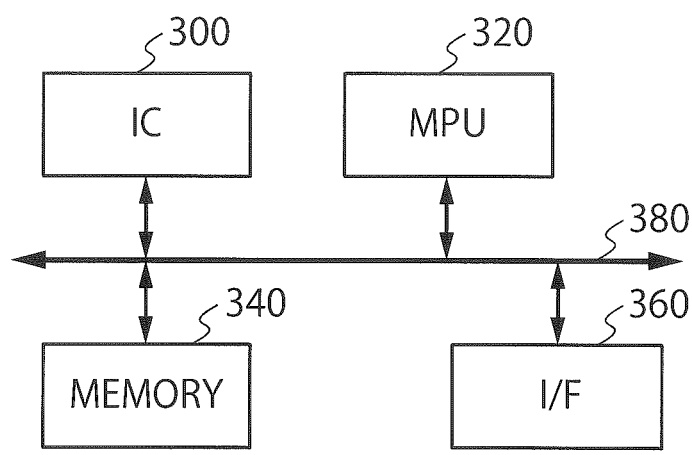
FIG. 12 is a block diagram illustrating an electronic device according to a second embodiment.

FIG. 12 shows an electronic device according to a second embodiment. The electronic device according to the second embodiment includes a circuit 300 including the integrated circuit according to the first embodiment, a microprocessor (hereinafter also referred to as "micro-processing unit (MPU)") 320, a memory 340, and an interface (I/F) 360, which are connected by a bus 380.

The MPU 320 operates according to a program. The memory 340 stores the program for operating the MPU 320. The memory 340 is also used as a working memory when the MPU 320 operates. The I/F 360 is controlled by the MPU 320 and communicates with external devices.

The effects of the second embodiment are the same as those of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An integrated circuit comprising:
    a first logic circuit configured to first implement logic information; and
    a first switch circuit configured to enable switching of wiring lines connected to the first logic circuit,
    the first logic circuit comprising:
    a first memory;
    a first look-up table circuit having a first output terminal for outputting data stored in the first memory based on a first input signal;
    a first selection circuit having a first input terminal to which the first output terminal is connected, a second input terminal that receives scan input data, and a second output terminal, the first selection circuit being configured to select one of the first input terminal and the second input terminal based on a scan enable signal and connect selected one of the first input terminal and the second input terminal to the second output terminal;
    a first flip-flop having a third input terminal connected to the second output terminal and a third output terminal; and
    a second selection circuit having a fourth input terminal connected to the third output terminal, a fifth input terminal connected to the first output terminal, and a fourth output terminal, the second selection circuit being configured to select one of the fourth input terminal and the fifth input terminal based on an enable signal and connect selected one of the fourth input terminal and the fifth input terminal to the fourth output terminal, the first switch circuit performing the switching of the wiring lines in response to signals from the third output terminal and the fourth output terminal.

2. The integrated circuit according to claim 1, wherein the first switch circuit includes a second memory, to which data can be written only once, and performs the switching of the wiring lines using the data stored in the second memory.

3. The integrated circuit according to claim 2, wherein the second memory includes a first wiring line, a second wiring line intersecting with the first wiring line, and a switching element disposed in an intersection region between the first wiring line and the second wiring line, the switching element having a first terminal connected to the first wiring line and a second terminal connected to the second wiring line.

4. The integrated circuit according to claim 3, wherein the switching element is an anti-fuse element or a resistive change element.

5. The integrated circuit according to claim 1, further comprising: a second logic circuit configured to second implement logic information; and a second switch circuit configured to enable switching of wiring lines connected to the second logic circuit, the second logic circuit comprising:
a second memory;
a second look-up table circuit having a five output terminal for outputting data stored in the second memory based on a second input signal;
a third selection circuit having a sixth input terminal to which the five output terminal is connected, a seventh input terminal to which the third output terminal is connected, and a sixth output terminal, the third selection circuit being configured to select one of the sixth input terminal and the seventh input terminal based on the scan enable signal and connect selected one of the sixth input terminal and the seventh input terminal to the sixth output terminal;
a second flip-flop having an eighth input terminal connected to the sixth output terminal and a seventh output terminal; and
a fourth selection circuit having a ninth input terminal connected to the seventh output terminal, a tenth input terminal connected to the five output terminal, and an eighth output terminal, the fourth selection circuit being configured to select one of the ninth input terminal and the tenth input terminal based on the enable signal and connect selected one of the ninth input terminal and the tenth input terminal to the eighth output terminal,
the second switch circuit performing the switching of the wiring lines in response to signals from the third output terminal and the fourth output terminal.

6. The integrated circuit according to claim 5, wherein the second switch circuit includes a third memory, to which data can be written only once, and performs the switching of the wiring lines using the data stored in the third memory.

7. A test method for testing a circuit in which a plurality of integrated circuits according to claim 1 are arranged in an array form, and the third output terminal of the flip-flop included in one of adjacent logic circuits is connected to the second input terminal of the first selection circuit included in the other of the adjacent logic circuits, the test method comprising:
expressing the look-up table circuit as logic gates using a truth table of the look-up table circuit of the logic circuit and arrangement information of the integrated circuit;
forming a scan chain using the arrangement information;
generating a test pattern by means of an automatic test pattern generator based on the arrangement information;
generating a modified test pattern in which predetermined data is given to the flip-flop of the logic circuit of the integrated circuit, which is not included in the scan chain of the integrated circuits;
causing the integrated circuit to be in a scan mode using a scan enable signal; and
performing a test using the modified test pattern as scan input data.

8. The test method according to claim 7, wherein the switch circuit includes a second memory, to which data can be written only once, and performs the switching of the wiring lines using the data stored in the second memory.

9. The test method according to claim 8, wherein the second memory includes a first wiring line, a second wiring line intersecting with the first wiring line, and a switching element disposed in an intersection region between the first wiring line and the second wiring line, the switching element having a first terminal connected to the first wiring line and a second terminal connected to the second wiring line.

10. The test method according to claim 9, wherein the switching element is an anti-fuse element or a resistive change element.

11. An electronic device comprising:
the integrated circuit according to claim 1;
a third memory configured to store a program; and
a processor configured to perform a process on the integrated circuit according to the program stored in the third memory.

12. The electronic device according to claim 11, wherein the switch circuit includes a second memory, to which data can be written only once, and performs the switching of the wiring lines using the data stored in the second memory.

13. The electronic device according to claim 12, wherein the second memory includes a first wiring line, a second wiring line intersecting with the first wiring line, and a switching element disposed in an intersection region between the first wiring line and the second wiring line, the switching element having a first terminal connected to the first wiring line and a second terminal connected to the second wiring line.

14. The electronic device according to claim 13, wherein the switching element is an anti-fuse element or a resistive change element.

* * * * *